AMPLIFIER CIRCUIT HAVING REACTIVE LOAD

Filed Feb. 28, 1948 5 Sheets-Sheet 1

INVENTOR
B.M. OLIVER
BY Hugh S. Wertz
ATTORNEY

AMPLIFIER CIRCUIT HAVING REACTIVE LOAD

Filed Feb. 28, 1948 5 Sheets-Sheet 2

INVENTOR
B. M. OLIVER
BY Hugh S. Wertz
ATTORNEY

AMPLIFIER CIRCUIT HAVING REACTIVE LOAD

Filed Feb. 28, 1948 5 Sheets-Sheet 3

INVENTOR
B. M. OLIVER
BY Hugh S. Wertz
ATTORNEY

AMPLIFIER CIRCUIT HAVING REACTIVE LOAD

Filed Feb. 28, 1948

5 Sheets-Sheet 4

INVENTOR
B. M. OLIVER
BY Hugh S. Wertz
ATTORNEY

July 25, 1950 B. M. OLIVER 2,516,797

AMPLIFIER CIRCUIT HAVING REACTIVE LOAD

Filed Feb. 28, 1948 5 Sheets-Sheet 5

INVENTOR
B. M. OLIVER
BY Hugh S. Wertz
ATTORNEY

Patented July 25, 1950 2,516,797

UNITED STATES PATENT OFFICE 2,516,797

AMPLIFIER CIRCUIT HAVING REACTIVE LOAD

Bernard M. Oliver, New York, N. Y., assignor to Bell Telephone Laboratories, Incorporated, New York, N. Y., a corporation of New York Application February 28, 1948, Serial No. 11,913

17 Claims. (Cl. 315—27)

This invention relates to amplifier circuits and more specifically to that type of amplifier circuit used to drive a reactive load, such as, for example, the sweep coils for producing deflection of the beam in a cathode ray tube.

It is an object of this invention to increase the efficiency of amplifiers which are used to drive reactive loads.

If a straightforward class A amplifier is used to drive the horizontal deflection coils in a high voltage television cathode ray tube, a large amount of plate power is required. This is because considerable energy is stored in the reactive load each cycle and then wasted during the fly-back time. To avoid this waste, a variety of circuits, called "booster circuits" employing "damper tubes" have been used. These circuits are widely used today in home television receivers. They have the considerable drawback, however, of being hard to adjust. A number of controls are required and these controls are interdependent. Thus the control called "horizontal size" affects the linearity and the one called "horizontal linearity" affects the size, etc. Even with a fortuitous adjustment the results are far from satisfactory. The present invention, in one of its primary aspects, relates to an amplifier circuit for applying sweep waves to the deflecting coils of a high voltage cathode ray television tube and in which these defects are minimized.

It is an object of this invention to decrease the number of adjustments required in the operation of an amplifier circuit for deflecting waves.

It is another object of this invention to increase the linearity of amplification in an amplifier for deflection waves.

It is a further object of this invention to greatly decrease the amount of power drawn from a voltage source in the amplification of sweep waves.

It is still another object of this invention to obtain a supply of high voltage from an amplifier circuit for deflecting waves without affecting the fly-back time of the wave or the drain of power from the source used to supply plate voltage to the amplifier.

These and other objects are attained in accordance with an exemplary embodiment of the invention by providing a circuit for driving the deflecting coils of a cathode ray tube (such as in a television receiver) comprising two tubes operated in push-pull manner under class B conditions and characterized by the fact that one of these tubes draws its plate power (for one-half of the deflecting portion of each sweep wave cycle) from the energy stored in the reactive load by the other tube during the other half of the deflecting portion of the sweep wave cycle. This reactive load can be either the deflecting coils or a transformer connected to them. This stored energy is also sufficient to provide high voltage for the beam acceleration in the cathode ray tube or for other purposes without any increase in consumption from the B-supply providing the plate power. By employing a feedback connection from the output of this amplifier circuit to the input thereof, it is possible to attain the high degree of linearity heretofore obtainable not only with high current drain circuits but with a power consumption comparable to or less than that of existing present-day circuits having poor output linearity.

The invention will be more readily understood by referring to the following description taken in connection with the accompanying drawings forming a part thereof in which.

Figure 1:
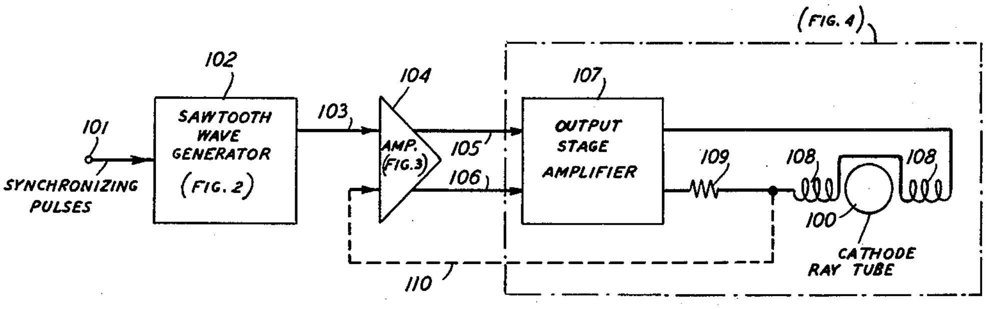
Fig. 1 shows, in block schematic form, a magnetic deflection system for a cathode ray beam, the system embodying an amplifier circuit in accordance with the invention.
Figures 3, 4:
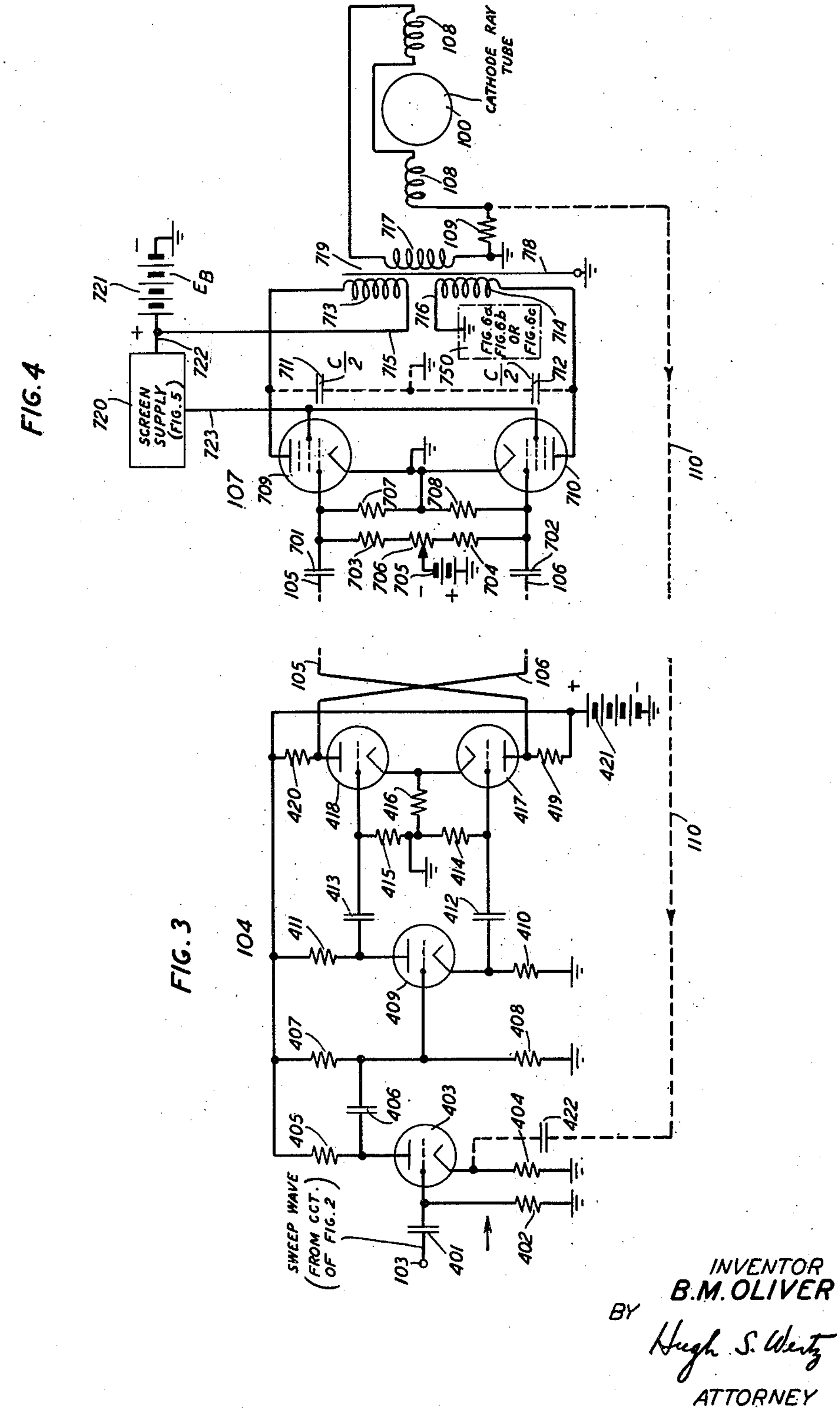
Fig. 3 is a schematic diagram of the first amplifier used in the system of Fig. 1.
Fig. 4 is a schematic diagram of the output stage amplifier in the system of Fig. 1 together with the reactive load therefor.
Figure 6A:
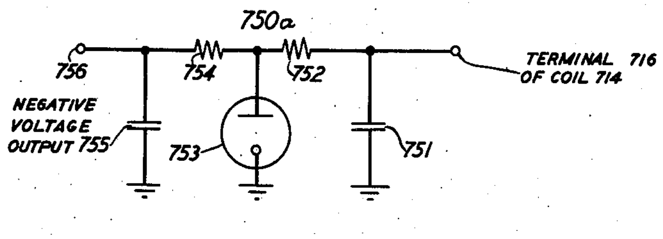
Figure 6B:
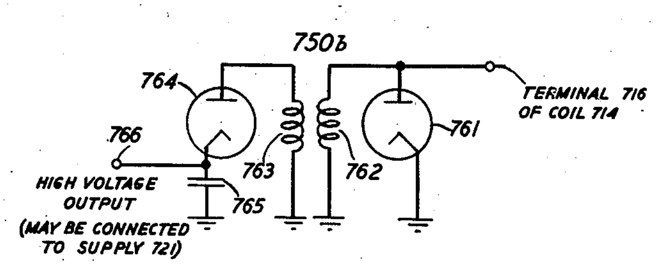
Figure 6C:
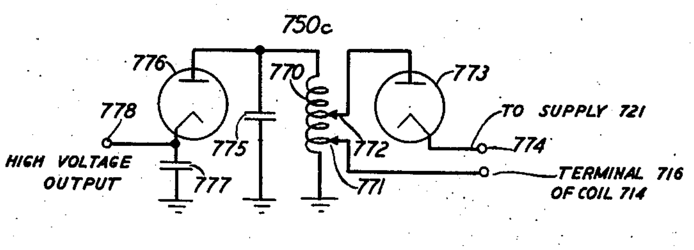
Figure 8:
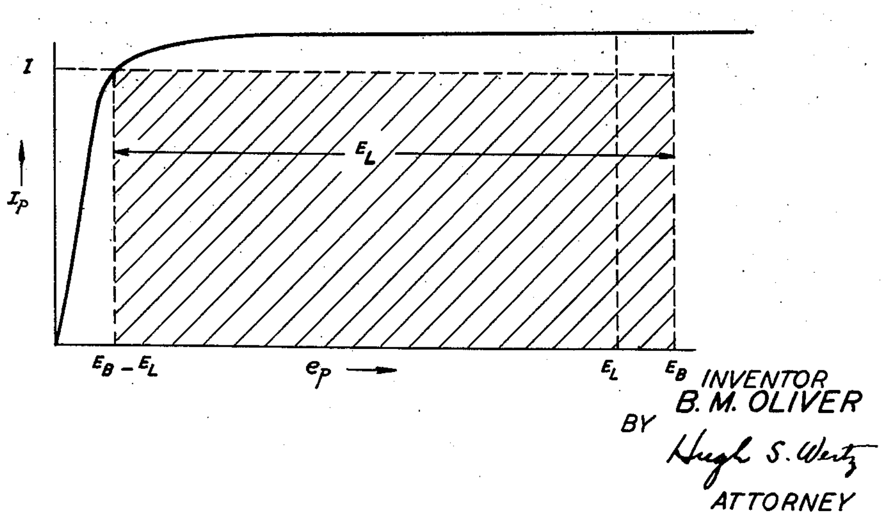

Figs. 6*a*, 6*b*, and 6*c* are schematic diagrams of typical power utilization circuits which can be associated with the circuit of Fig. 4;

Figs. 7*a* to 7*m*, inclusive, are representations of the wave forms of certain of the current and voltages at various points in the system shown in Fig. 1; and Fig. 8 is a plate voltage characteristic curve of a typical pentode tube used in explaining the operation of the invention.

Referring more specifically to the drawings, Fig. 1 shows, by way of example for purposes of illustration and in block schematic form, a deflection system for a magnetically deflected cathode ray tube 100. The deflection system includes a saw-tooth wave generator 102 (shown in greater detail in Fig. 2), a first amplifier 104 (shown in greater detail in Fig. 3), and an output stage amplifier 107 the output circuit of which is connected to deflecting coils 108 for the cathode ray tube 100 (the amplifier 107 and its load being shown in greater detail in Fig. 4). Synchronizing pulses of any well-known form such as the horizontal or vertical synchronizing pulses produced from the standard RMA television signal, for example, are applied to the terminal 101 of the saw-tooth wave generator 102. In response to these pulses the saw-tooth wave generator 102 produces a series of saw-tooth voltage waves which appear at terminal 103. The first amplifier 104 amplifies these waves and by means of a "phase splitter" or "phase inverter" stage produces a balanced or push-pull output on the leads 105 and 106. The waves on lead 105 are in the same sense as the input to the amplifier while those on lead 106 are in the opposite sense. The waves on leads 105 and 106 are applied as a balanced input to the output stage amplifier 107 which drives the deflection coils 108 with a saw-tooth wave form of current. Preferably a resistor 109 is in series with the deflection coils 108. The voltage across this resistor, which is a measure of the current in the coils 108, is fed back by way of lead 110 to the input amplifier 104. By means of this feedback connection, the current in the deflection coils 108 can be made to correspond closely to the input voltage of the first amplifier 104, as is well known in the art.

While the invention relates primarily to the novel circuit arrangement of the first and output stage amplifiers 104 and 107 and to various power utilization circuits which are associated therewith, nevertheless, to aid in the understanding and the operation of the entire system, a brief description of a satisfactory saw-tooth wave generator 102 will first be given.

Figure 2:
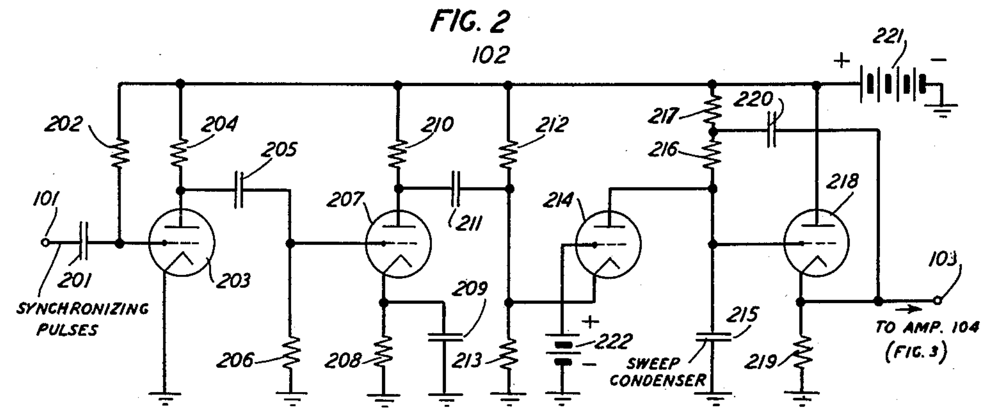
Fig. 2 is a schematic diagram of the saw-tooth generator used in the system of Fig. 1.
Figures 7A, 7B, 7C, 7D, 7E, 7F:
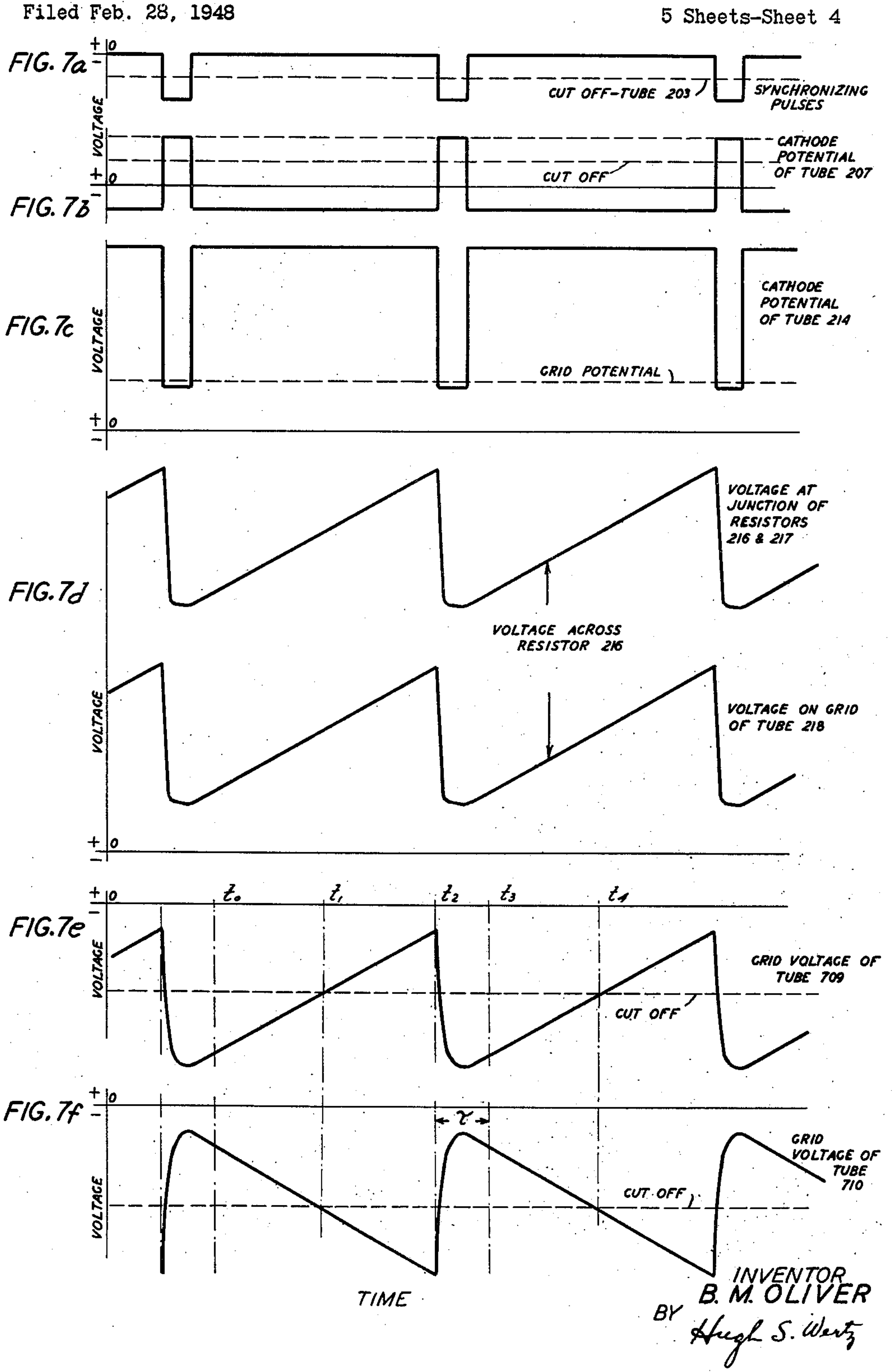

Referring now to Fig. 2, the sweep generator 102 comprises four tubes 203, 207, 214 and 218 and circuit elements associated therewith. Negative synchronizing pulses having the form shown in Fig. 7*a* are applied to the terminal 101 and, by means of the coupling condenser 201, to the grid of the tube 203. This tube is normally conducting current between pulses as its grid is held at substantially cathode potential by the flow of current through resistor 202. During each synchronizing pulse, this tube 203 is cut off and the cessation of plate current causes a positive voltage pulse to appear across the resistor 204 in its plate circuit. This positive pulse is applied through the coupling condenser 205 to the grid of the tube 207. Tube 207 is normally non-conducting as a result of the positive voltage developed across the parallel combination of the resistor 208 and the condenser 209 in its cathode circuit by the average plate current. When the positive pulses, which are similar to those shown in Fig. 7*b*, are applied to the grid of the tube 207, this tube conducts a large amount of plate current. The resistance of the resistors 210, 212 and 213 is so great that during the pulse, most of the plate current required by the tube 207 is drawn through the condenser 211 from the cathode of the tube 214. The condenser 211 becomes charged somewhat as a result, but is discharged between pulses by current through the resistors 210, 212 and 213. Resistors 212 and 213 are so proportioned that when tube 207 is non-conducting (between pulses) the cathode of tube 214 is more positive than either the grid or plate of this tube. As a result, no plate current flows in tube 214 between pulses. During each pulse, however, the cathode potential of tube 214 drops, as shown in Fig. 7*c*, until the current required by tube 207 can be supplied by space current in tube 214. Part of this space current is drawn as grid current in the tube and part as plate current. The plate current discharges sweep condenser 215 until the plate of tube 214 drops to cathode potential. The remainder of the cathode current drawn by tube 214 is then drawn from the grid. As a result, at the end of the synchronizing pulse, all of the elements of tube 214, as well as the upper terminal of condenser 215, are substantially at the positive potential of the supply 222. This supply is shown for convenience as a separate voltage source, but can, in practice, be a voltage divider across supply 221. After each pulse, the positive potential of the cathode of tube 214 increases again and no further plate current flows in this tube until the next pulse.

Condenser 215 now starts to recharge as a result of current supplied by the source 221 through resistors 216 and 217. As is well known, this recharge would normally be along an exponential curve. However, the upper (ungrounded) terminal of condenser 215 is also connected to the grid of tube 218. In the cathode circuit of this tube is a high resistance 219. As the grid voltage of tube 218 changes, comparatively little change in the grid to cathode voltage of tube 218 is required to supply the change in current required by resistor 219 and the associated circuit. As a result, the cathode potential of tube 218 closely follows changes in the grid potential of this tube. The voltage wave across condenser 215 is therefore accurately reproduced at the output terminal 103. This wave is also applied through coupling condenser 220 to the junction between resistors 216 and 217. Since any change in potential of the lower end of resistor 216 as shown in Fig. 2 produces an equal change in potential of the upper end of this resistor, the voltage across resistor 216 is constant, and a constant current flows in this resistor. Fig. 7*d* shows the voltage waves on the two ends of resistor 216. The constant current through resistor 216 recharges condenser 215 at a constant rate and a linear rise of voltage with time is produced and appears at the output terminal 103.

Referring now to Fig. 3, which is a schematic diagram of the amplifier 104, the output of the saw-tooth wave generator is applied to terminal 103. The amplifier 104 comprises a first amplifying stage comprising tube 403, a "phase splitter" stage comprising tube 409, and a balanced third stage comprising tubes 417 and 418 which stage acts as a driver for the output stage amplifier 107 of Fig. 4. Voltage variations of terminal 103 are applied to the grid of tube 403 through coupling condenser 401. If negative feedback from the deflection coils is used, the voltage across resistor 109 (of Figs. 1 and 4) can be applied through feedback lead 110 (shown dotted) and condenser 422 to the cathode of tube 403. The plate current in tube 403 then varies in accordance with the variations in the difference of potential between leads 103 and 110. The amplified voltage developed across resistor 405 is applied through condenser 406 to the grid of tube 409. The grid of tube 409 is held at a positive potential by resistors 407 and 408 acting as a voltage divider across the supply 421. The cathode of this tube is connected to ground through resistor 410 and the plate is connected to the positive terminal of the supply 421 through an equal resistor 411. The plate current of tube 409 flowing through equal resistors 410 and 411 produces a positive voltage on the cathode of this tube and an equal voltage drop across resistor 411. Any plate current change produces equal and opposite voltage changes on the plate and cathode. The cathode voltage varies in the same sense as the grid voltage while the plate voltage varies in the opposite sense. The tube 409 thus acts as a "phase splitter" and its balanced output voltages are applied through condensers 412 and 413 to the grids of tubes 417 and 418, respectively. These two tubes are connected as a push-pull class A amplifier stage in the manner shown, which is well known in the art, resistors 414 and 415 being the grid resistors, 416 the cathode bias resistor, and 419 and 420 the plate load resistors. The balanced or push-pull output waves appear across terminals 105 and 106.

Fig. 4 shows a circuit arrangement of the output stage amplifier 107 and its reactive load. The amplifier 107 comprises tubes 709 and 710 the input circuits of which are connected in the usual push-pull fashion and the output circuits of which are connected in novel manner to the primary windings 713 and 714 of an output transformer 719. The balanced output voltage waves, of the amplifier 104, appearing on leads 105 and 106 are applied through coupling condensers 701 and 702 to the control grids of tubes 709 and 710, respectively. The sense of the saw-tooth waves is such that during the linear or "forward" portion of the sweep cycle the potential of the control grid of tube 709 becomes less and less negative while the control grid of tube 710 becomes more and more negative. Then during the sudden return or "fly-back" portion of the cycle the control grid of tube 709 again drops more negative in potential while the control grid of tube 710 rises to a less negative potential. The two grid waves are illustrated in Figs. 7*e* and 7*f*, for tubes 709 and 710, respectively. The average control grid potential of tube 709 is held negative by resistors 707 and 703, together with part of potentiometer 706 acting as a voltage divider across negative supply 705, while the grid of tube 710 is held negative by the similar arrangement comprising resistors 708 and 704 and the rest of potentiometer 706. Potentiometer 706 serves to adjust the relative control grid potentials and thus to balance the operation of the tubes as will be explained later. The screen grids of tubes 709 and 710 are held at a positive potential during the "forward" portion of the cycle by the screen supply 720, the function of which will also be explained later in connection with Fig. 5. The cathodes of both tubes 709 and 710 are connected to ground. The plate of tube 709 is connected to the positive supply 721 of voltage $E_B$ through the primary winding 713 of output transformer 719, while the plate of tube 710 is connected through the other primary winding 714 of the output transformer 719 to ground, or to a power utilization device 750 indicated by the dotted rectangle. Typical power utilization devices will be described later in connection with Fig. 6. The secondary winding 717 of the output transformer 719 is connected to the deflection coils 108 of the cathode ray tube 100. As mentioned before, a resistor 109 can be included in this output circuit to develop a feedback voltage on lead 110. The two primary windings 713 and 714 of the output transformer are wound "series aiding" as in a conventional push-pull output transformer and in a preferred arrangement have substantially the same number of turns. The output transformer 719 preferably also includes an electrostatic shield 718 between the primary windings 713 and 714 and the secondary winding 717. The distributed or stray capacity associated with the transformer and the plates of tubes 709 and 710 are indicated by the two capacities 711 and 712 designated "C/2" in the drawing.

Figures 7G, 7H, 7I, 7J, 7K, 7L, 7M:
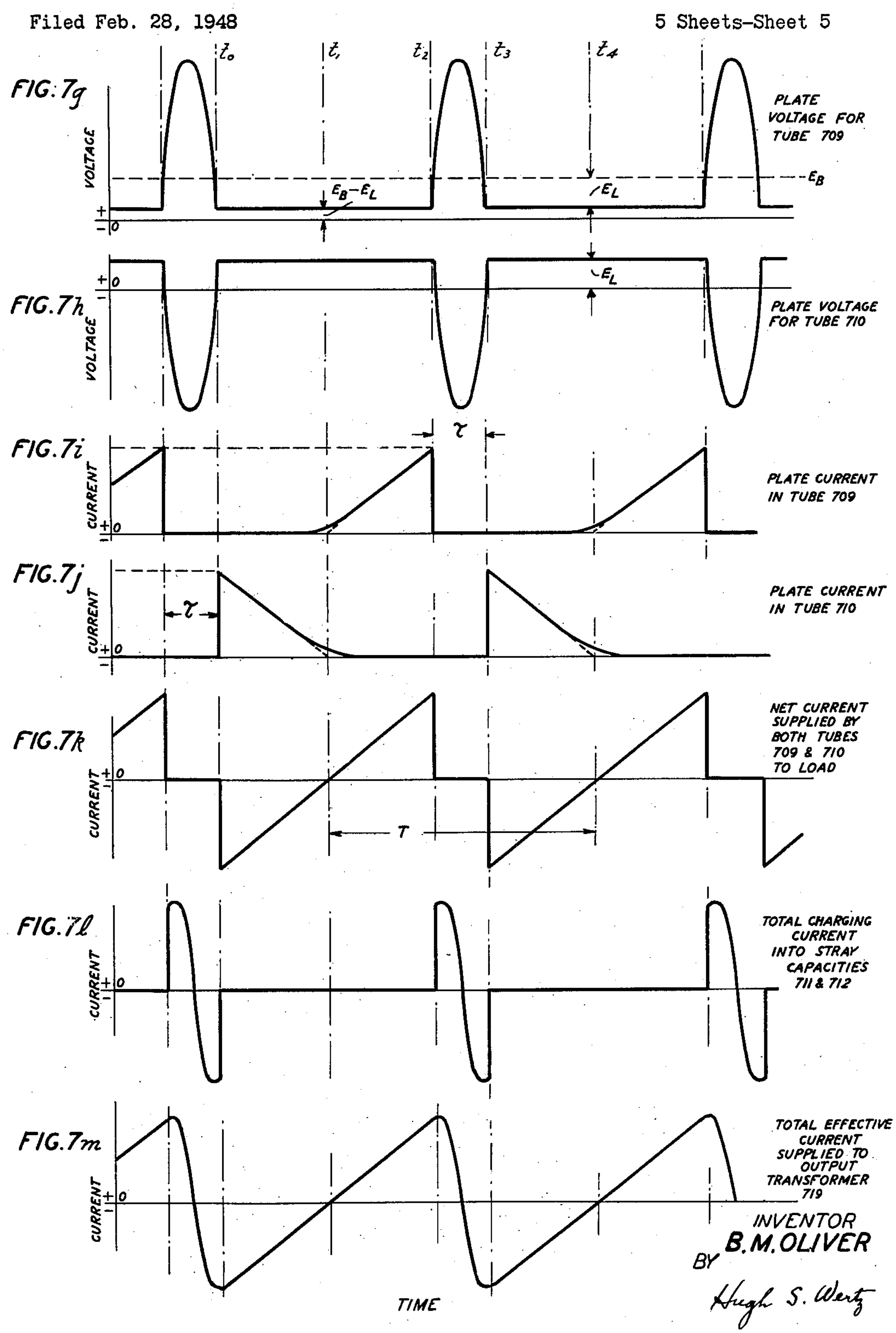

The cycle of operation of the circuit of Fig. 4 will now be described. The control grids of the tubes 709 and 710 are so biased that at a time $t_1$ corresponding to the middle of the forward portion of the input waves, both tubes are substantially cut off (i. e., non-conducting) as indicated in Figs. 7*e* and 7*f*. As time proceeds, tube 710 is completely cut off while the control grid potential of tube 709 becomes less negative. Accordingly, plate current in tube 709 increases in a substantially linear fashion as shown in Fig. 7*i*. The linear increase in plate current in tube 709 causes the plate voltage of this tube to be lowered to a value $E_B-E_L$, where $E_B$=voltage of supply 721

$$E_L=L\frac{di}{dt}$$

$L$=inductance of winding 713 with deflecting coils 108 connected to winding 717

$t$=time.

If windings 713 and 714 are equal, a positive voltage $E_L$ is present on the plate of tube 710 during the forward portion of the cycle. The plate voltage waves for tubes 709 and 710 are shown in Figs. 7*g* and 7*h*, respectively.

At the time $t_2$, the plate current in tube 709 reaches the value I. At this time the grid voltage of tube 709 is driven negative by the input wave (Fig. 7*e*) and the plate current drops to zero. This sudden stoppage of plate current in tube 709 induces a transient in the load circuit causing the plate voltage of tube 709 to be driven very positive and the plate voltage of tube 710 to be driven very negative. During this time, indicated as $\tau$ in the figures, neither tube 709 nor tube 710 can, therefore, conduct plate current. Tube 709 cannot conduct because of the highly negative grid voltage, while tube 710 cannot conduct plate current because the plate voltage is negative. A current step of magnitude I is thus introduced to the load (at time $t_2$ in Fig. 7*i*). The load transient, assuming the damping to be small, is a substantially sinusoidal oscillation of angular frequency $$\omega_0=\frac{1}{\sqrt{LC}}$$

Now the time $\tau$ is approximately one half cycle of this oscillation, i. e., $\omega_0\tau\cong\pi$. At the time $t_3=t_2+\tau$, the current in the deflection coils has reversed, and the potential of the plate of tube 710 again becomes positive. The control grid of this tube is now at a potential such that a plate current I can flow in the tube. When this happens, a second step of current of magnitude I is applied to the load at time $t_3$ (Fig. 7*j*) in the same sense as the first step from tube 709 at time $t_2$. The load transient from this second step, being one half cycle later, is directly out of phase with the transient from the first step and the two waves cancel, leaving the plate of tube 710 at the potential $E_L$, and a current I in winding 714. The control grid potential of tube 710 now goes more negative decreasing the plate current in a linear fashion until the middle of the cycle is again reached at time $t_4=t_1+T$, where T=duration of one complete saw-tooth cycle. At the time $t_4$, tube 709 again takes over, and the cycle repeats.

Actually, because of small losses in the load circuit, the oscillation will decay slightly during the fly-back time and the peak current demanded from tube 710 will be slightly less than the peak current in tube 709. To correct for this effect, and for possible mismatch between tubes 709 and 710, the potentiometer 706 is included. By adjusting this potentiometer the onset of current in tube 710 can be controlled so as to cancel completely the fly-back transient. If feedback is used around the amplifier, the setting of potentiometer 106 is not critical.

The plate current cycle of tube 709 is shown in Fig. 7*i*, while that of tube 710 is shown in Fig. 7*j*. The difference between these two currents, which is the net current supplied by both tubes to the load, is shown in Fig. 7*k*. Fig. 7*l* shows the total charging current into the two stray capacities 711 and 712. The sum of the currents in Figs. 7*k* and 7*l* is the total effective current (Fig. 7*m*) supplied to the output transformer. It will be seen that the current in Fig. 7*m* consists of a series of saw-tooth waves having a linearly increasing (forward) portion, and a sinusoidally decreasing (fly-back) portion. The peak to peak value of this wave is 2I.

In practice, the return or fly-back time of the waves, $\tau$, would be a much smaller fraction of the total cycle time, T, than the proportions shown in the figures.

The average plate current in tube 709 is seen from Fig. 7*i* to be roughly $$\frac{I}{4}$$

This is the only plate current drain on the supply 721. Neglecting screen currents, then (since these are relatively small) the total current drain from the power supply 721 is roughly ⅛ of the peak to peak sweep current referred to the primary of the output transformer. If a single tube were used as a class A amplifier in the output stage instead of the push-pull arrangement described above, the peak plate current required in this tube, for the same output power as before, would be at least 2I. The average current would be at least I, and all of this current would be drawn from the plate power supply. Accordingly, the plate power requirement of the output stage according to this invention is roughly ¼ that for a conventional "unbalanced" (i. e., not push-pull) class A output stage.

The plate power requirement of a conventional sweep amplifier output stage is sometimes reduced by the use of a so-called "damper tube" or "damping diode" shunted across the deflecting coils. This tube is poled so as to conduct during the first half of the forward portion of the sweep wave, at the end of the fly-back time. This damping tube thus supplies a pulse of current to the load somewhat analogous to the current supplied by tube 710 in the present circuit. Accordingly, the sweep amplifier tube proper can be nearly cut off for this time and the plate power drain is reduced. If the current pulse in the damper tube can be made a proper supplement to the current in the amplifier tube a linear sweep wave can be obtained. However, this is difficult to do in practice, and good results are rarely obtained. Negative feedback cannot be effectively used with this type of circuit to linearize the sweep because during part of the forward portion of the sweep wave, the amplifier tube is non-conducting and no loop transmission exists.

In the present circuit, the plate current waves of tubes 709 and 710 are naturally supplementary as in a conventional, linear, push-pull class B amplifier, and relative unbalances between the tubes can be largely compensated through proper adjustment of the relative grid biases using potentiometer 706. In addition, negative feedback can be used with the present circuit to attain a very high degree of sweep linearity, since transmission is always present either through tube 709 or 710 or both.

Figure 5:
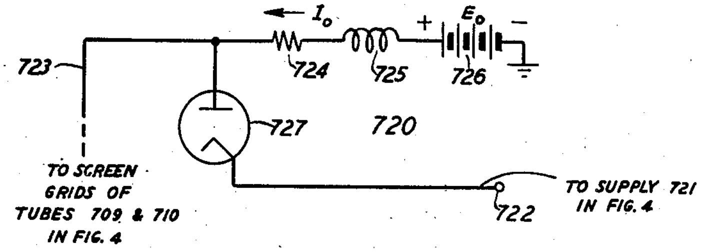
Fig. 5 is a schematic diagram of a protective circuit which can be used as part of the circuit of Fig. 4.

During the interval $\tau$, the control grid of tube 710 is at a potential such that the tube would conduct a large plate current if the plate were positive. Consequently a large screen grid current may be drawn by tube 710 during this time if the screens were connected directly to the positive terminal of supply 721. If the interval $\tau$ is an appreciably large fraction of the total cycle, the normal screen dissipation in this tube may be exceeded and the current drain from supply 721 materially increased. To prevent this, the screen current for tube 710 (and, as shown, for tube 709 also) can be drawn from a special supply device 720. A schematic diagram of a suitable device for this purpose is shown in Fig. 5. The screen grids of tubes 709 and 710 are connected to terminal 723. This terminal is connected to the plate of diode 727 and also through resistor 724 and inductance 725 to a positive voltage supply, 726, of voltage $E_0$. The cathode of diode 727 is connected to the positive supply 721 (in Fig. 4) of voltage $E_B$. $E_0$ is assumed to be more positive than $E_B$. Resistor 724 is so chosen that the current through it, $I_0$, is slightly greater than the maximum screen current drawn by either tube 709 and 710 during the forward portion of the cycle. Diode 727 accordingly conducts the excess current during this time and fixes the potential of terminal 723 to be only slightly more positive than terminal 722. When tube 710, during fly-back, attempts to draw screen current in excess of $I_0$, the diode 727 stops conducting and the potential of terminal 723 falls. Inductance 725 prevents the current to the screen from rising materially above the value $I_0$ during the time $\tau$. In practice, supply 721 can be an electronically regulated power supply, and supply 726 can then be merely a tap on the unregulated voltage developed within this supply.

If the interval $\tau$ is sufficiently short, as will often be the case in practice, screen supply 720 can be omitted and the screens of tubes 709 and 710 can be connected directly to supply 721.

Fig. 8 shows the typical plate current vs. plate voltage characteristic of a pentode tube such as might be used for tubes 709 and 710. Assume this curve to represent the characteristic with the grid voltage at the minimum negative value. The supply voltage, $E_B$, is indicated on this figure. The actual plate voltage on tube 709 will be less than $E_B$ by an amount $$E_L=L\frac{di}{dt}$$

and is indicated as $E_B-E_L$ in the figure. The energy stored in the load is proportional to the shaded area in the figure, i. e., energy in load at end of cycle $$=\frac{1}{2}LI^2=L\int_0^I idi=L\int_{t_1}^{t_2} i\frac{di}{dt}dt=E_L\int_{t_1}^{t_2} idt=E_LI\frac{t_2-t_1}{2}$$

In a proper design, L is chosen (by a suitable turns ratio in the output transformer) so that the shaded area in Fig. 8 ($E_LI$) is maximized. When this is done, the proportions are approximately as shown in Fig. 8. If the windings 713 and 714 of the output transformer are equal, tube 710 will now have a positive plate voltage of $E_L$ during the forward part of the cycle. Actually a plate voltage of $E_B-E_L$ is sufficient to allow tube 710 to conduct the maximum required current I. In other words, with the inner end 716 of winding connected to ground as shown in Fig. 4, the plate voltage on tube 710 during the forward portion of the cycle is higher than necessary by an amount $2E_L-E_B$. Accordingly, the terminal 716 can be connected to any one of several types of power utilization devices and an amount of power equal to $$\frac{I}{4}(2E_L-E_B)$$

can be delivered to this device. This excess power would otherwise be dissipated at the plate of tube 710. Typical power utilization devices are shown in Figs. 6*a*, 6*b* and 6*c*.

Referring to Fig. 6*a*, the terminal 716 of the transformer winding 714 is shown connected to a large condenser 751, the lower end of which is grounded. The plate current pulses passed by tube 710 are drawn from this condenser. As this action proceeds, the top plate of condenser 751 becomes negatively charged. This top plate of condenser 751 is connected through a small resistor 752 to the cathode of a gas tube 753. The anode of this gas tube is grounded. When the voltage across the condenser 751 reaches a predetermined value, equal to or less than $2E_L-E_B$, the gas tube 753 breaks down, and by conducting the excess current, prevents any appreciable further increase in voltage across condenser 751. Also connected to the cathode of the gas tube is a filter resistor 754. Connected to the other end of resistor 754 is the output terminal 756 and the by-pass or filter condenser 755. An amount of current approximately equal to $$\frac{I}{4}$$

can be supplied to the negative terminal 756 before the current in the gas tube fails. The circuit of Fig. 6*a* can thus supply a useful negative voltage output equal to or less in magnitude than $E_B-2E_L$ at any current drain less than $$\frac{I}{4}$$

Referring to Fig. 6*b*, the terminal 716 of winding 714 is shown connected to the anode of a diode 761 and to the primary winding 762 of a transformer. The cathode of the diode 761 and the other end of the winding 762 are grounded. Pulses of current drawn by tube 710 from terminal 716 pass through the winding 762 and induce voltage pulses across the winding 763. The bottom of winding 763 is grounded and the top connects to the anode of diode 764. The cathode of diode 764 is by-passed to ground by condenser 765 and is also connected to output terminal 766. During the voltage pulses which appear across winding 763, the diode 764 conducts current and charges condenser 765. Between these pulses diode 764 is non-conducting. Accordingly, condenser 765 becomes charged so that terminal 766 is positive. The diode 761 serves to damp out any positive voltages which may appear as transients on terminal 716 after each current pulse. The positive voltage developed at terminal 766 can have a wide range of values by choice of the turns ratio of the transformer, and can also be made negative by reversing the connections of the diode 764 and the sense of winding 763. In a typical case, the terminal 766 can be connected to the supply 721 and the condenser 765 can then be omitted. In this case the circuit of Fig. 6*b* effectively returns current and power to the supply 721, thus further reducing the drain on this supply.

In Fig. 6*c*, the terminal 716 of winding 714 is shown connected to a tap 771 on an inductance 770. The lower end of this inductance is grounded and the upper end connects to the anode of a diode 776 and to a tuning capacity 775, the lower terminal of which is grounded. The cathode of diode 776 connects to an output terminal 778 and to a filter or by-pass condenser 777 the lower terminal of which is grounded. A second tap 772 on inductance 770 is connected to the plate of a diode 773, the cathode of which connects through terminal 774 to a positive reference voltage source, such as supply 721. The inductance 770 and the capacity 775 are chosen so that together they resonate at the fundamental frequency of saw-tooth waves applied to the output stage 107. Pulses of current drawn by tube 710 from terminal 716 excite the tuned circuit comprising inductance 770 and capacity 775, causing a substantially sinusoidal voltage to appear across these elements. On the peaks of this sinusoidal voltage wave, diode 776 conducts and charges condenser 777 positively. As the oscillation continues to build up, the positive excursion of tap 772 soon becomes sufficient to cause diode 773 to conduct and deliver current to terminal 774 (and thus to source 721). The conduction of diode 773 thus limits the amplitude of the oscillation and a substantially constant positive voltage is developed at terminal 778. By suitable choice of the inductance 770 and the tap positions 771 and 772 this output voltage can be made as high as several kilovolts. The circuit of Fig. 6*c* is thus a suitable second anode supply for the cathode ray tube. When no current is being drawn from terminal 778, diode 773 conducts a larger current and returns the unused power to the supply 721. In practice, diode 773 can be one-half of a twin diode tube, the other half of which is used as diode 727 in Fig. 5.

It should be noted that the power obtained from any of these power utilization devices is free in the sense that this power would otherwise be wasted as plate dissipation in tube 710. The use of any of these devices imposes no further load on the deflection circuit and requires no increase in plate drain from the supply 721. In fact, the current drain from the supply 721 is reduced with certain of the devices. This is in contradistinction to the conventional type of "fly-back" high voltage supply associated with the horizontal deflection circuit in certain television applications. There, the rectification of the high voltage during fly-back damps the return oscillation of the deflection circuit, and this in turn requires an increase in the current requirement of the driver stage.

If for any reason, the reactive voltage from the load is insufficient to provide plate voltage for tube 710, a supplemental source (smaller than the supply 721) can be provided in the plate circuit of tube 710.

Various modifications, other than those specifically mentioned above, can be made in the embodiments described above without departing from the spirit of the invention, the scope of which is indicated in the claims. The invention is applicable to both recurring and to certain non-recurring sweeps and the term "wave," as used in the claims, is applicable to either.

What is claimed is:

1. A circuit arrangement comprising a first and a second control device each having an input and an output circuit, means for applying to each of said input circuits an input wave, a reactive load, a power source in the output circuit of the first only of said devices, means comprising said first device and said power source for supplying energy to said load during one portion of said wave, and means comprising the second of said devices for controlling the removal of energy from said load during another portion of said wave.

2. A circuit arrangement for generating a sweep wave having a forward or sweeping portion and a fly-back portion, comprising a first and a second control device each having an input and an output circuit, means for applying to each of said input circuits an input wave, a reactive load, a power source in the output circuit of the first of said devices, means comprising said first device and said power source for supplying energy to said load during one-half of the sweeping portion of said wave thereby storing energy in said load, and means comprising the second of said devices for controlling the removal of energy from said load during the other half of the sweeping portion of said wave.

3. A circuit arrangement comprising a first and a second control device each having an input and an output circuit, means for applying to each of said input circuits in push-pull manner an input wave, a reactive load, a power source in the output circuit of the first only of said devices, means comprising said first device and said power source for supplying energy to said load during one portion of said wave, and means comprising the second of said devices for controlling the removal of energy from said load during another portion of said wave.

4. A circuit arrangement comprising two control devices each having an input and an output circuit, means for applying to each of said input circuits an input wave, a reactive load, a power source in the output circuit of one of said devices, means comprising said one device and said power source for supplying energy to said load during one portion of said wave, means comprising the second of said devices for controlling the removal of energy from said load during another portion of said wave, and means apart from said load and in the output circuit of said second device for utilizing energy removed from said load.

5. A circuit arrangement comprising two space current devices each having an input and an output circuit, means for applying to each of said input circuits an input wave, a reactive load, a power source in the output circuit of one only of said devices, means comprising said one device and said power source for supplying energy to said load during one portion of said wave, means comprising the second of said devices for controlling the removal of energy from said load during another portion of said wave, and means apart from said load for utilizing energy removed from said load.

6. A circuit arrangement comprising two control devices each having an input and an output circuit, means for applying to each of said input circuits an input wave, a reactive load, a power source in the output circuit of one only of said devices, means comprising said one device and said power source for supplying energy to said load during one portion of said wave, and means comprising the second of said devices for controlling the removal of energy from said load during another portion of said wave.

7. An amplifier circuit comprising two electron discharge devices each having an input and an output circuit, means for applying in push-pull manner to the input circuits of said two devices a saw-tooth wave each cycle of which has a sweeping portion and a return portion, a reactive load, means including a source of direct potential connected in the output circuit of the first of said devices for storing energy in said reactive load for a part of the sweeping portion of each cycle of the saw-tooth wave, and means including said reactive load for returning power from said reactive load to the output circuit of the second of said devices during another part of said sweeping portion of each cycle.

8. An amplifier circuit comprising two electron discharge devices each having an input and an output circuit, means for applying in push-pull manner to the input circuits of said two devices a saw-tooth wave each cycle of which has a sweeping portion and a return portion, a reactive load including a transformer having two primary windings and a secondary winding with an inductive element connected thereto, means including a source of direct potential connected in the output circuit of the first of said devices and one of said primary windings for storing energy in the reactive load for part of the sweeping portion of each cycle of the saw-tooth wave, and means including said second primary winding and said secondary winding for returning power from the reactive load to the output circuit of the second of said devices during another part of the sweeping portion of each cycle.

9. An amplifier circuit comprising two electron discharge devices each having an input and an output circuit, means for applying in push-pull manner to the input circuits of said two devices an input voltage wave having a portion during which the potential change in one direction is accomplished within a certain time period and another portion during which the potential change in the opposite direction is accomplished within a shorter time period, a reactive load, means including a source of direct potential connected in the output circuit of the first of said devices for storing energy in said load for a part of the first-mentioned portion of the input wave, and means including said load for returning power from the reactive load to the output circuit of the second of said devices during another part of said first-mentioned portion of said input wave.

10. An amplifier circuit comprising two electron discharge devices each having an input and an output circuit, means for applying in push-pull manner to the input circuits of said two devices an input voltage wave having a portion during which the potential change in one direction is accomplished within a certain time period and another portion during which the potential change in the opposite direction is accomplished within a shorter time period, a reactive load, means including a source of direct potential connected in the output circuit of the first of said devices for storing energy in said load for a part of the first-mentioned portion of the input wave, and means for taking a voltage from the output circuit of said second device which is larger than the voltage of said source of direct potential.

11. An amplifier circuit for a non-sinusoidal wave of the type in which there is a relatively slow variation in one direction followed by a relatively rapid variation in the opposite direction, comprising a first amplifier, an output stage amplifier connected to said first amplifier, said output stage amplifier comprising two tubes each including an anode, a cathode and a control element, a reactive load connected to both anodes, a source of direct potential, means for applying anode voltage from the source of direct potential to one only of said tubes, means for returning power from said reactive load to supply anode voltage for the second of said tubes, and means for feeding back energy from said load to said first amplifier.

12. An amplifier circuit for a voltage variation having a relatively slow change in one direction followed by a relatively rapid change in the opposite direction, comprising two tubes each having an anode, a cathode and a control element, means for applying said voltage variation in push-pull manner to the control element-cathode circuits of said two tubes, a reactive load, means for connecting said output circuits in push-pull manner to said reactive load, a source of direct potential, means for applying said source to the anode-cathode circuit of the first of said tubes only, and means including said reactive load for applying anode voltage to the second of said tubes.

13. An amplifier circuit for an input wave comprising two tubes each having an input and an output circuit, means for applying said input wave in push-pull manner to both input circuits, a common load, means for connecting each of said output circuits to said load, and means for applying direct potential to the output circuit of one only of said two tubes.

14. An amplifier circuit for an input wave having a substantially slow variation in one direction followed by a relatively fast variation in the opposite direction comprising two tubes each having an anode, a cathode, a control element and a screen grid, a reactive load, means for applying said input wave in push-pull manner between the anode and cathode of each of said tubes, means for connecting both of said anodes to said reactive load, means for applying direct potential to the anode of one only of said tubes, means for maintaining both screen grids at all times positive with respect to their corresponding cathodes, and means for decreasing said screen grid potential during the rapidly varying part of said input wave.

15. An amplifier circuit including an anode, a cathode, a control element and a screen grid, means for applying an input wave between the control element and cathode of said device of such form that it causes said grid to vary both positively and negatively with respect to said cathode, means for applying a potential between the anode and the cathode of said device which causes said anode to at times have a potential which is negative with respect to said cathode, means for applying a potential to said screen grid which is at all times positive with respect to said cathode, and means for decreasing the value of said screen grid potential whenever, at the same time, the control element potential is positive with respect to said cathode and said anode voltage is negative with respect thereto.

16. An amplifier circuit including an anode, a cathode, a control element and a screen grid, means for applying an input wave between the control element and cathode of said device of such form that it causes said grid to vary both positively and negatively with respect to said cathode, means for applying a potential between the anode and the cathode of said device which causes said anode to at times have a potential which is negative with respect to said cathode, means for applying a potential to said screen grid which is at all times positive with respect to said cathode, and means for decreasing the value of said screen grid potential whenever, at the same time, the control element potential is positive with respect to said cathode and said anode voltage is negative with respect thereto, said last-mentioned means including a diode which is normally conducting but which becomes non-conducting when the screen grid current exceeds a predetermined amount.

17. An amplifier for sweep waves which are adapted to be applied to the deflecting coils of a cathode ray tube, said sweep wave having a forward portion and a return portion, comprising two tubes, means for applying the sweep wave to both of said tubes, a reactive load, circuit means for applying energy from one of said tubes to said load during one part of the forward portion of said sweep wave, and means for returning energy from said reactive load to said other tube during another portion of the forward sweep of said input wave.

BERNARD M. OLIVER.

REFERENCES CITED

The following references are of record in the file of this patent:

UNITED STATES PATENTS

| Number | Name | Date |
|---|---|---|
| 2,180,365 | Norton | Nov. 21, 1939 |
| 2,280,733 | Tolson | Apr. 21, 1942 |
| 2,280,990 | White | Apr. 28, 1942 |